United States Patent [19]

Miyake

[11] Patent Number: 6,023,770
[45] Date of Patent: Feb. 8, 2000

[54] SEMICONDUCTOR DEVICE

[75] Inventor: Takashi Miyake, Tokyo, Japan

[73] Assignee: Mitsubishi Denki Kabushiki Kaisha, Tokyo, Japan

[21] Appl. No.: 09/038,846

[22] Filed: Mar. 12, 1998

[30] Foreign Application Priority Data

Oct. 3, 1997 [JP] Japan .................................... 9-271780

[51] Int. Cl.[7] ................................ G06F 1/04; G06F 1/24
[52] U.S. Cl. .......................... 713/401; 713/500; 713/601
[58] Field of Search ................................... 713/400, 401, 713/500, 600, 601; 714/23

[56] References Cited

U.S. PATENT DOCUMENTS

| | | | |
|---|---|---|---|
| 5,303,390 | 4/1994 | Little ............................................ | 714/1 |
| 5,359,232 | 10/1994 | Eitrheim et al. ........................ | 327/116 |
| 5,552,727 | 9/1996 | Nakao ..................................... | 327/159 |

FOREIGN PATENT DOCUMENTS 4-264907   9/1992   Japan ................. G06F 1/24
7-281783  10/1995   Japan ................. G06F 1/10

*Primary Examiner*—Dennis M. Butler
*Attorney, Agent, or Firm*—Burns, Doane, Swecker & Mathis, LLP

[57] ABSTRACT

A semiconductor device capable of solving problems involved in a conventional semiconductor device in that when a clock frequency is multiplied in the semiconductor device itself, the generation timing the an internal reset signal is shifted owing to supply voltage fluctuation of the like, and hence a plurality of test patterns must be prepared for respective test items when testing the semiconductor device. The present semiconductor device includes an internal clock halt circuit for suspending or passing a first internal clock signal to generate a second internal clock signal to be supplied to a signal synchronizing circuit in response to a signal applied to an external input terminal, and a data latch circuit for latching an external reset signal in response to the second internal clock signal output from the internal clock halt circuit, thereby controlling the interval at which the data latch circuit stops its latch operation.

12 Claims, 8 Drawing Sheets

ONE TEST RATE

SEMICONDUCTOR DEVICE

BACKGROUND OF THE INVENTION

1. Field of the Invention

The present invention relates to an improvement in a semiconductor device including a noise canceling circuit for removing noise of an external input signal such as a reset signal.

2. Description of Related Art

Figure 9:
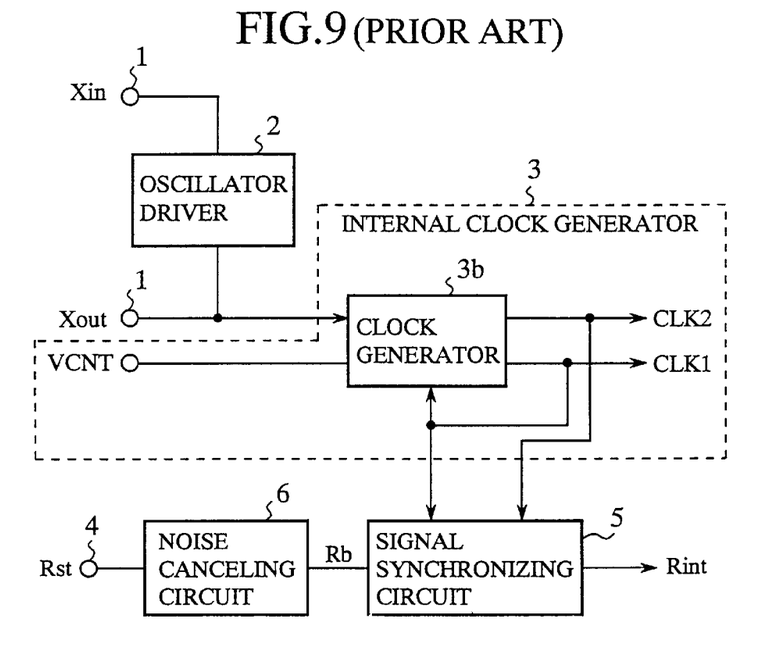
FIG. 9 is a block diagram showing a configuration of a reset signal input section and its associates of a conventional semiconductor device.

FIG. 9 is a block diagram showing a configuration of a reset signal input section and its associates of a conventional semiconductor device. In FIG. 9, the reference numerals 1 and 1 designate external clock input terminals to which a crystal oscillator not shown is connected; and 2 designates an oscillator driver for driving the crystal oscillator connected to the external clock input terminals 1 and 1. The reference numeral 3 designates an internal clock generator which is connected to the external clock input terminals 1 and 1, and outputs two internal clock signals CLK1 and CLK2 with a frequency twice that of an external clock signal Xin in synchronism with the external clock signal Xin. The reference numeral 4 designates an external input terminal to which the external reset signal Rst is applied; and 5 designates a signal synchronizing circuit 5 which latches the external reset signal Rst by the first internal clock signal CLK1, and output an internal reset signal Rint. The reference numeral 6 designates a noise canceling circuit that is connected between the external input terminal 4 and the signal synchronizing circuit 5, and passes only the external reset signal Rst with a width equal to or greater than d1.

Figure 10:
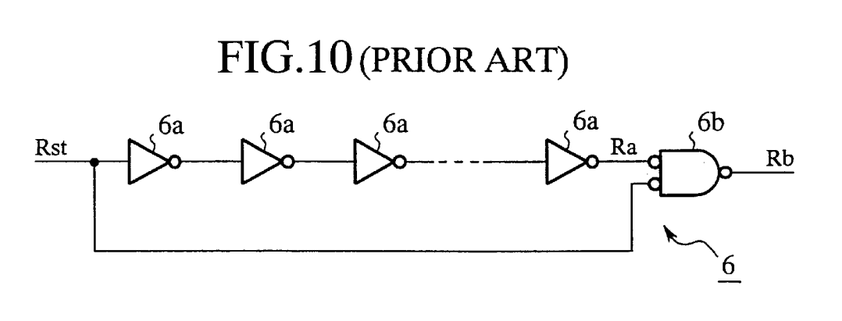
FIG. 10 is a block diagram showing a configuration of a noise canceling circuit 6 of the conventional semiconductor device.

FIG. 10 is a block diagram showing a configuration of the noise canceling circuit 6. In FIG. 6, the reference numerals 6a, 6a, . . . , 6a each designate a delay buffer consisting of a switching device in the semiconductor device; and 6b designates a two-input logical AND circuit which carries out negative OR operation of the delayed reset signal Ra passing through the delay buffers 6a, . . . 6a, and the external reset signal Rst directly supplied from the external input terminal 4, and outputs a noise canceled reset signal Rb which falls to a low level when both the input signals are at the low level. The noise canceling circuit 6 with such an arrangement outputs the reset signal Rb only when the external reset signal Rst input to the external input terminal 4 at present and a little time before are both low. In other words, the external reset signal Rst with a width of d1 and more which is low at the two timings are input to the signal synchronizing circuit 5, and noise or the like with a width less than d1 is not input to the signal synchronizing circuit 5.

Figure 11:
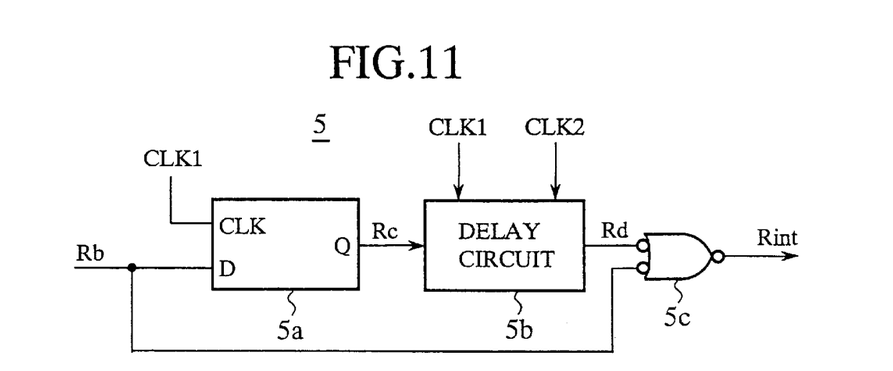
FIG. 11 is a block diagram showing a configuration of a signal synchronizing circuit 5 of the conventional semiconductor device.

FIG. 11 is a block diagram showing a configuration of the signal synchronizing circuit 5. In FIG. 11, the reference numeral 5a designates a data latch circuit for latching the external reset signal Rb output from the noise canceling circuit 6 by the first internal clock signal CLK1 output from the internal clock generator 3; and 5b designates a delay circuit which receiving the first internal clock signal CLK1 and second internal clock signal CLK2, delays the external reset signal Rc, which is latched and output by the data latch circuit 5a, by an amount of two internal clock periods 2T using the input clock signals CLK1 and CLK2. The reference numeral 5c designate a two input logical OR circuit which inputs the reset signal Rb output from the noise canceling circuit 6 at a first input, and the reset signal Rd output from the delay circuit 5b at a second input, and outputs the internal reset signal Rint of the low level when at least one of the two inputs are at the low level. Thus, the low level width of the internal reset signal Rint is equal to or greater than the two internal clock periods 2T.

Next, the operation of the conventional semiconductor device will be described.

Figure 12:
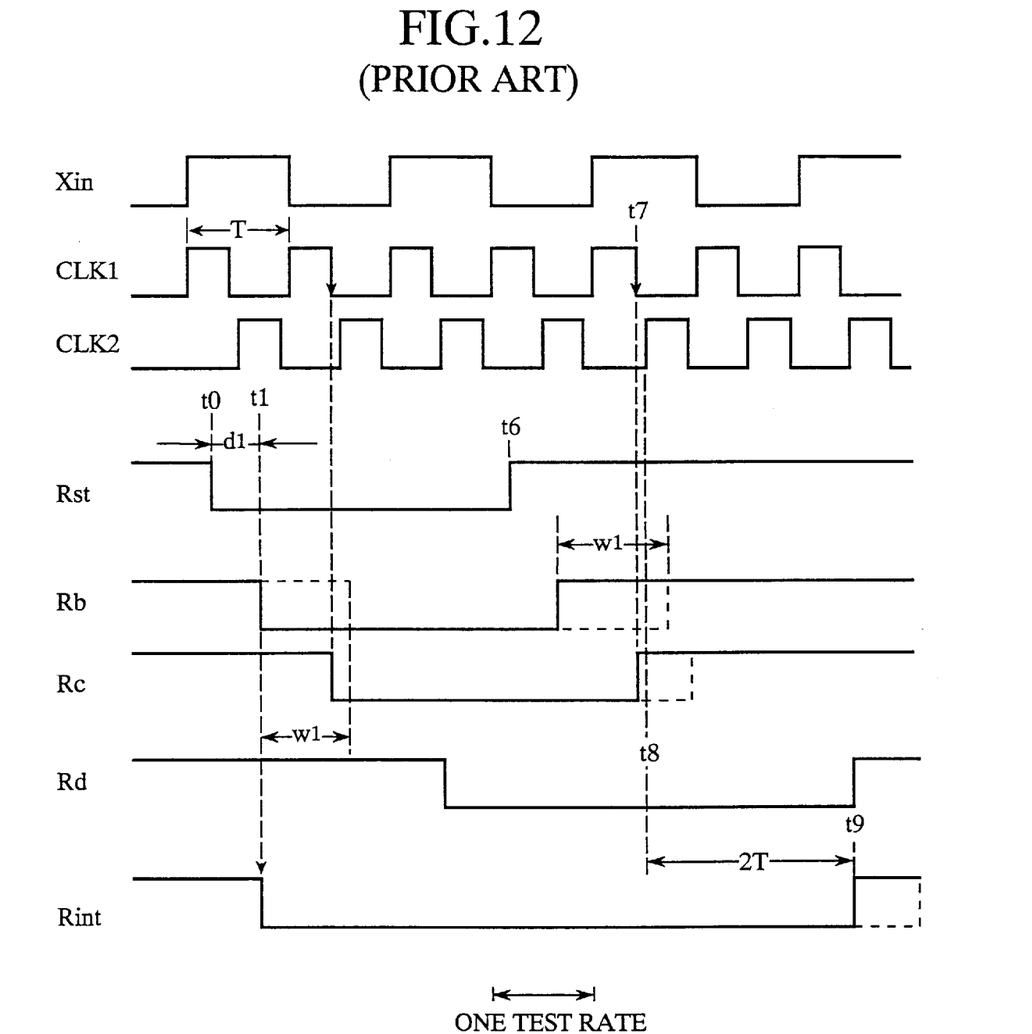
FIG. 12 is a timing chart illustrating timing relationships of important waveforms from the input of a reset signal Rst to the generation of an internal reset signal Rint in the conventional semiconductor device.

FIG. 12 is a timing chart illustrating the timing relationships from the input of the external reset signal Rst and to the generation of the internal reset signal Rint.

As illustrated in FIG. 12, when the low level external reset signal Rst is input to the external input terminal 4 at time t0, the internal reset signal Rint falls to the low level at time t1 which is later than time t0 by a delay time d1 due to the noise canceling circuit 6. When the input of the external reset signal Rst to the external input terminal 4 returns to the high level at time t6, the output Rc of the data latch circuit 5a returns to the high level at the falling edge of the next first internal clock signal CLK1 at time t7. Then, the internal reset signal Rint returns to the high level at time t9 which is later than the rising edge of the second internal clock signal CLK2 at time t8 by an amount of the two internal clock periods 2T.

Since the conventional semiconductor device has such a configuration, if the ambient conditions like the power supply voltage and temperature of the noise canceling circuit 6 fluctuate, the timing of the noise canceled reset signal Rb output therefrom greatly varies as indicated by w1 in FIG. 12, even if the external reset signal Rst is synchronized with a particular cycle of the external clock signal.

As a result, the synchronization is lost between the timing of the reset signal Rb output from the noise canceling circuit 6 and the internal clock cycle, so that the internal reset signal Rint output from the signal synchronizing circuit 5 is shifted by an amount of at least one internal clock period T. This presents a problem in an operation test of the semiconductor device in that the operation start timing of the semiconductor device after the input of the external reset signal Rst shifts by an amount of at least one internal clock period T, thereby outputting unexpected output results at respective clock cycles in the operation test.

In particular, the synchronization loss becomes an important problem in the development of a semiconductor device which increases its operation frequency by multiplying the clock frequency in itself because of the difficulty in stable supply of an external clock signal at a high operation frequency. This is because although the clock period in such a semiconductor device becomes much shorter than that in a conventional one, the time interval from the input of the external reset signal Rst to the output of the internal reset signal Rint is kept long and fluctuates in response to the power supply voltages and temperature as in the conventional one.

Incidentally, noise canceling circuits can be interposed in signal paths other than the reset signal path to protect the internal circuit. However, since noise cancellation periods of such noise canceling circuits are much shorter than that of the noise canceling circuit described above, and their delay times little vary, this does not matter normally. Nevertheless, if they involve a time delay matching that of the noise canceling circuit 6 of the reset signal Rst, a similar problem can occur.

Besides, in the semiconductor device which increases its operation frequency by multiplying the clock frequency in itself as described above, it is common that the internal clock generator 3 is arranged such that it self-oscillates the internal clock at its unique frequency, and has its phase synchronized with an external clock signal using a phase-locked loop. In the semiconductor device with such an arrangement, the generation of the internal clock signal cannot be halted by suspending the input of the external clock signal. Therefore, the synchronization of the reset signal Rst with the clock signal cannot be established in the semiconductor device by suspending the input of the external clock signal.

Figure 13:
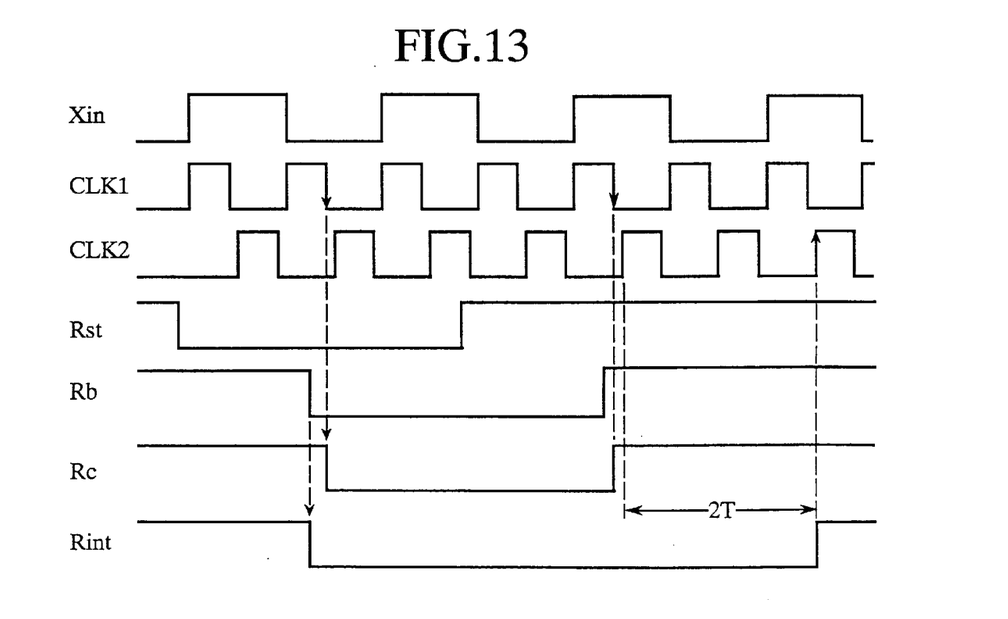
FIG. 13 is another timing chart illustrating timing relationships of important waveforms from the input of a reset signal Rst to the generation of an internal reset signal Rint in the conventional semiconductor device.

For the reasons described above, it is necessary for the conventional semiconductor device to prepare test patterns as shown in FIG. 13, for example, which differs from the test pattern as shown in FIG. 12, and to carry the predetermined tests by using appropriate patterns in accordance with the ambient conditions such as the supply voltages and temperature. This presents other problems of lengthening the design term of the semiconductor device, reducing productivity in volume production, and demanding reinforcement of test facilities. Incidentally, the description of FIG. 13 will be omitted here, because the waveforms illustrated in FIG. 13 operate in the same way as those of FIG. 12, although their patterns differ from each other.

SUMMARY OF THE INVENTION

The present invention is implemented to solve the foregoing problems. It is therefore an object of the present invention to provide a semiconductor device that can positively synchronize an internal input signal such as an internal reset signal to a particular cycle of a clock signal independently of the environmental conditions such as a supply voltage or temperature.

According to a first aspect of the present invention, there is provided a semiconductor device comprising: a first input terminal to which a first external input signal is applied; a second input terminal to which a second external input signal is applied; an external clock input terminal to which an external clock signal is applied; an internal clock generator for generating an internal clock signal synchronized with the external clock signal; a noise canceling circuit connected to the first input terminal for passing only the first external input signal with a width equal to or greater than a predetermined width; a signal synchronizing circuit for generating an internal input signal by latching and delaying an output of the noise canceling circuit; and an internal clock input halt circuit connected between the internal clock generator and the signal synchronizing circuit for suspending input of the internal clock signal to the signal synchronizing circuit in response to the second external input signal, wherein the signal synchronizing circuit generates the internal input signal in response to an output of the internal clock input halt circuit.

Here, the second input terminal may comprise at least two terminals for inputting an operation mode control signal for designating one of a test mode and a normal mode, and a general purpose port input signal fed from a general purpose register in the semiconductor device, and the internal clock halt circuit may control input and suspension of the internal clock signal to the signal synchronizing circuit in response to the operation mode control signal and the general purpose port input signal.

According to a second aspect of the present invention, there is provided a semiconductor device comprising: a first input terminal to which a first external input signal is applied; an external clock input terminal to which an external clock signal is applied; an internal clock generator for generating a first internal clock signal synchronized with the external clock signal by multiplying a frequency of the external clock signal; a noise canceling circuit connected to the first input terminal for passing only the first external input signal with a width equal to or greater than a predetermined width; an internal clock frequency divider connected to the internal clock generator for dividing a frequency of the first internal clock signal to generate a second internal clock signal; and a signal synchronizing circuit for generating an internal input signal by latching the external input signal in response to the second internal clock signal.

Here, the internal clock frequency divider may latch the external clock signal by the first internal clock signal, and output it as the second internal clock.

According to a third aspect of the present invention, there is provided a semiconductor device comprising: a first input terminal to which a first external input signal is applied; a second input terminal to which a second external input signal is applied; an external clock input terminal to which an external clock signal is applied; an internal clock generator for generating an internal clock signal synchronized with the external clock signal; a noise canceling circuit connected to the first input terminal for passing only the first external input signal with a width equal to or greater than a predetermined width; an input signal select circuit for selectively connecting to its output one of the first input terminal and an output of the noise canceling circuit in response to the second external input signal; and a signal synchronizing circuit for generating an internal input signal by latching an output of the input signal select circuit.

Here, the input signal select circuit may comprise a first switching element connected between an output of the noise canceling circuit and an input of the signal synchronizing circuit, and a second switching element connected between the first input terminal and the input of the signal synchronizing circuit, and wherein the input signal select circuit may selectively bring one of the first and second switching elements into conduction in response to the second external input signal.

The first external input signal may be a reset signal for resetting the semiconductor device.

The internal clock generator may comprise a phase locked circuit that continues self-oscillation and synchronizes a self-oscillated signal to the external clock signal.

DETAILED DESCRIPTION OF THE PREFERRED EMBODIMENTS

The invention will now be described with reference to the accompanying drawings.

EMBODIMENT 1

Figure 1:
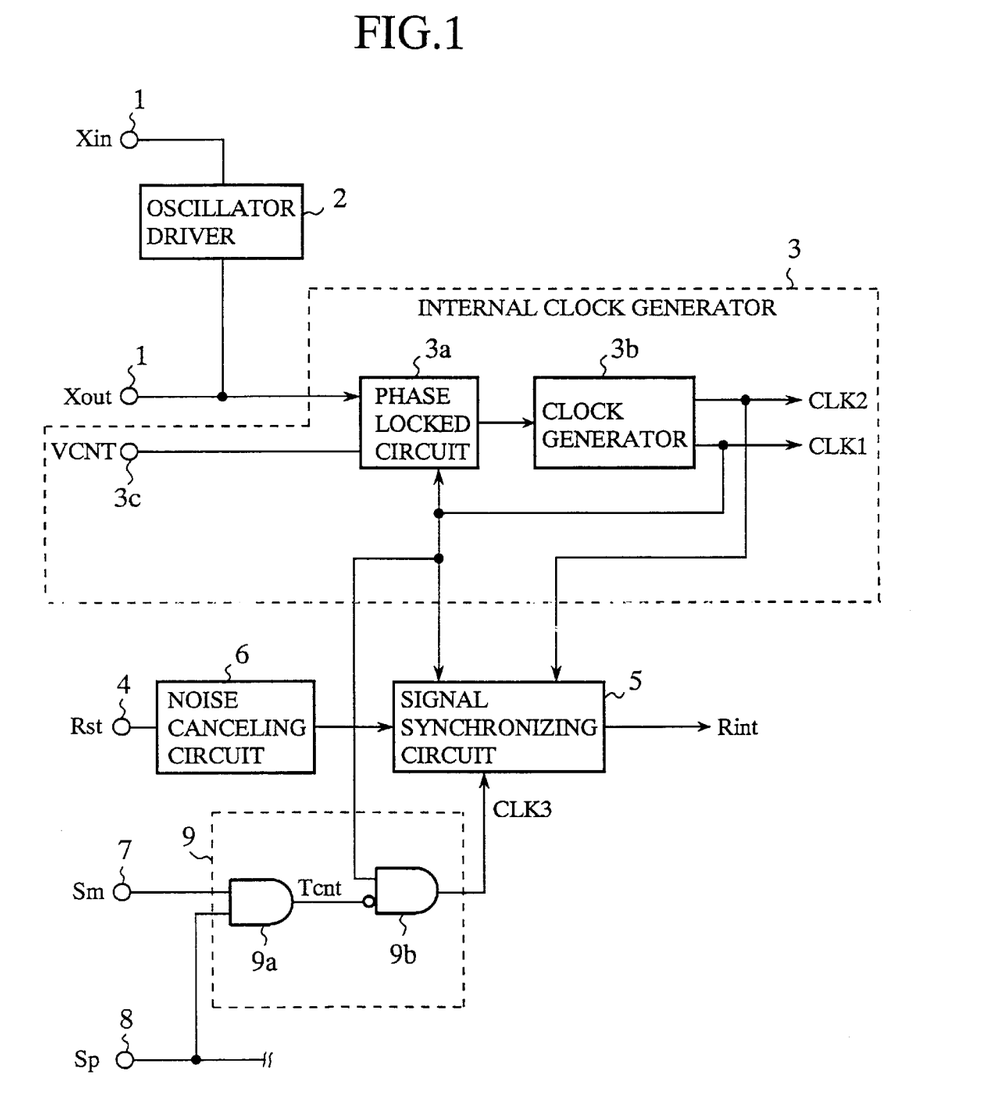
FIG. 1 is a block diagram showing a configuration of a reset signal input section and its associates of an embodiment 1 of a semiconductor device in accordance with the present invention.

FIG. 1 is a block diagram showing a configuration of a reset signal input section and its associates of an embodiment 1 of a semiconductor device in accordance with the present invention. In FIG. 1, the reference numerals 1 and 1 designate a pair of external clock input terminals to which a crystal oscillator not shown is connected; and 2 designates an oscillator driver for driving the crystal oscillator connected to the external clock input terminals 1 and 1. The reference numeral 3 designates an internal clock generator which self-oscillates at a frequency twice that of an external clock signal Xin, and outputs two internal clock signals CLK1 and CLK2 at different phases in synchronism with the external clock signal Xin. The reference numeral 4 designates an external input terminal to which the external reset signal Rst is applied; and 5 designates a signal synchronizing circuit 5 which latches and then delays the external reset signal Rst using the two internal clock signals CLK1 and CLK2, and outputs an internal reset signal Rint.

The reference numeral 6 designates a noise canceling circuit connected between the external input terminal 4 and the signal synchronizing circuit 5, for passing only the external reset signal Rst with a width equal to or greater than d1. The reference numeral 7 designates an operation mode input terminal (second input terminal) to which an operation mode control signal Sm for switching between a test mode and a normal mode is applied; and 8 designates a general purpose port terminal (second input terminal) connected to a general purpose register of the semiconductor device for inputting a general purpose port input signal Sp. The reference numeral 9 designates an internal clock input halt circuit which inputs the first internal clock signal CLK1, operation mode control signal Sm and general purpose port input signal Sp, generates the third internal clock signal CLK3 by decimating particular cycles of the first internal clock signal CLK1 in response to the signals Sm and Sp, and outputs it to the signal synchronizing circuit 5.

In FIG. 1, the reference numeral 9a designates an logical AND circuit that inputs the operation mode control signal Sm and general purpose port input signal Sp and outputs a high level signal when both of the inputs are at the high level; and 9b designates a gate circuit that decimates the first internal clock signal CLK1 when the output of the logical AND circuit 9a is at the high level, and outputs the third internal clock signal CLK3, in which the logical AND circuit 9a and gate 9b constitute an internal clock input halt circuit 9. The reference numeral 3a designates a phase locked circuit for outputting a synchronizing signal synchronized with the external clock signal; 3b designates a clock generator for outputting two internal clock signals CLK1 and CLK2 at different phases in response to the synchronizing signal; and 3c designates a terminal to which components (resistor and capacitor) are connected needed for supplying an analog voltage to the internal clock generator 3 from the phase locked circuit 3a, in which the phase locked circuit 3a, clock generator 3b and terminal 3c constitute the internal clock generator 3.

Figure 2:
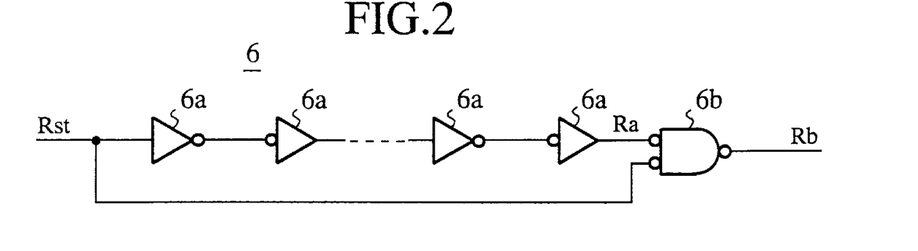
FIG. 2 is a block diagram showing a configuration of a noise canceling circuit 6 of the embodiment 1.

FIG. 2 is a block diagram showing a configuration of the noise canceling circuit 6. In FIG. 6, the reference numerals 6a, 6a, . . . , 6a each designate a delay buffer consisting of a switching device in the semiconductor device; and 6b designates a two-input logical AND circuit which carries out the negative OR operation of the delayed reset signal Ra passing through the delay buffers 6a, . . . , 6a, and the external reset signal Rst directly supplied from the external input terminal 4, and outputs a noise canceled reset signal Rb which is placed at the low level when both the input reset signals are at the low level. The noise canceling circuit 6 with such an arrangement outputs the reset signal Rb only when the external reset signal Rst input to the external input terminal 4 at present and at a little time before are both at the low level. In other words, the external reset signal Rst with a width of d1 and more which is at the low level at the two timings are input to the signal synchronizing circuit 5, and noise or the like with a width less than d1 is prevented from being input to the signal synchronizing circuit 5.

Figure 3:
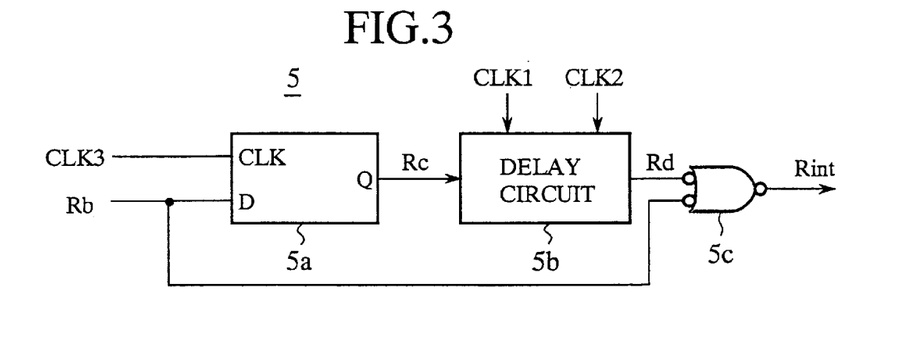
FIG. 3 is a block diagram showing a configuration of a signal synchronizing circuit 5 of the embodiment 1.

FIG. 3 is a block diagram showing a configuration of the signal synchronizing circuit 5. In FIG. 3, the reference numeral 5a designates a data latch circuit for latching the external reset signal Rb output from the noise canceling circuit 6 by the third internal clock signal CLK3; 5b designates a delay circuit which receiving the first internal clock signal CLK1 and second internal clock signal CLK2, delays the external reset signal Rc, which is output from the data latch circuit 5a, by an amount of two internal clock periods 2T using the internal clock signals CLK1 and CLK2; and 5c designate a two input logical OR circuit which receiving the reset signal Rb output from the noise canceling circuit 6 and the reset signal Rd output from the delay circuit 5b, outputs the internal reset signal Rint of the low level when at least one of the two inputs are at the low level. Thus, the low level width of the internal reset signal Rint is equal to or greater than the two internal clock periods 2T.

Next, the operation of the present embodiment 1 will be described.

Figure 4:
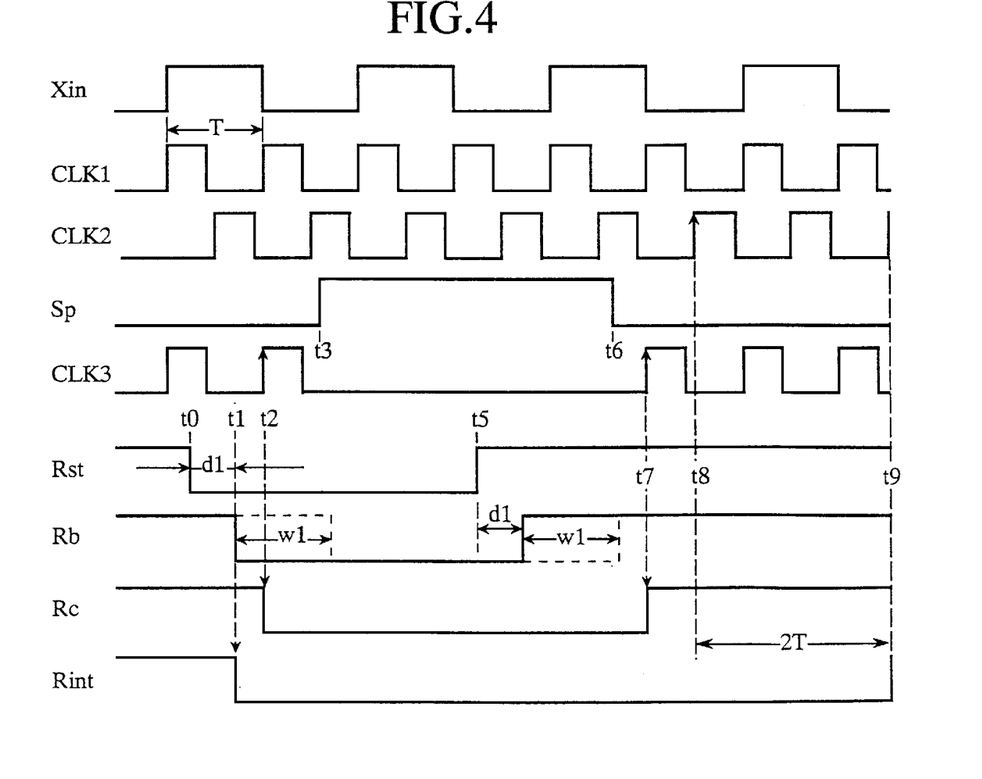
FIG. 4 is a timing chart illustrating timing relationships of important waveforms from the input of a reset signal Rst to the generation of an internal reset signal Rint in the embodiment 1.

FIG. 4 is a timing chart illustrating the timing relationships of various waveforms from the input of the external reset signal Rst and to the generation of the internal reset signal Rint.

When the operation mode control signal Sm is set at the high level indicative of the test mode, and the low level external reset signal Rst is input to the external input terminal 4 at time t0 in the condition that the general purpose port input signal Sp is set at the low level as illustrated in FIG. 4, the noise canceled reset signal Rb falls to the low level at time t1 which is later than the time t0 by the delay time d1 due to the noise canceling circuit 6. Thus, the internal reset signal Rint falls to the low level at the time t1. Subsequently, the signal Rb is latched to the data latch circuit 5a by the rising edge of the third internal clock signal CLK3 at time t2, so that a low level reset signal Rc is output from the data latch circuit 5a. The signal Rc is delayed by the two internal clock periods 2T by the delay circuit 5b, and is output as the reset signal Rd.

On the other hand, when the input of the external reset signal Rst to the external input terminal 4 returns to the high level at time t5, the output Rc of the data latch circuit 5a returns to the high level at the rising edge of the next third internal clock signal CLK3 at time t7. Thus, the internal reset signal Rint returns to the high level at time t9, the two internal clock periods 2T later than the rising edge of the second internal clock signal CLK2 at time t8 immediately after the time t7.

In the course of this, the general purpose port input signal Sp is set to the high level at time t3 after the time t2, at which the reset signal Rb is latched by the data latch circuit 5a, and hence the gate 9b is closed at the time t3. This results in suspending the output of the third internal clock signal CLK3. Thus, the data latch circuit 5a suspends the latch of the reset signal Rb, and holds its output Rc at the low level until the time t7, at which the fluctuation of the noise canceled reset signal Rb has been completed.

Afterward, when the general purpose port input signal Sp is returned to the low level at time t6, the gate 9b is opened, which enables the third internal clock signal CLK3 to be output in response to the first internal clock signal CLK1 at time t7 immediately after the time t6, so that the data latch circuit 5a restarts the latch operation. Thus, if the external reset signal Rst has returned to the high level by the time when the latch operation is restarted, the rising edge of the internal reset signal Rint is controlled such that it completes about two internal clock periods 2T later than the rising edge of the general purpose port input signal Sp.

In this case, even if the transfer delay of the noise canceling circuit 6 fluctuates as indicated by w1 in FIG. 4 owing to the changes in environmental conditions like supply voltages or temperature, the noise canceled reset signal Rb is not latched by the data latch circuit 5a until the time t7. Accordingly, if the signal Rb is settled at a stable condition by the time t7, the rising edge of the internal reset signal Rint can keep synchronization with the external clock signal in spite of the changes in the environmental conditions.

As described above, the embodiment 1 comprises the internal clock input halt circuit 9 for controlling the third internal clock signal CLK3 supplied to the signal synchronizing circuit 5 in response to the operation mode control signal Sm and general purpose port input signal Sp. Since the transfer delay of the two signals Sm and Sp are not affected by the fluctuations in the environment conditions like supply voltages or temperature, the timing of the rising edge of the internal reset signal Rint can be stably controlled by the general purpose port input signal Sp, independently of the self-oscillation of the internal clock generator 3 in synchronism with the external clock signal. In summary, controlling the pair of signals, the operation mode control signal Sm and general purpose port input signal Sp, enables the generation timings of the internal clock signals and internal reset signal Rint to be synchronized with the particular cycle of the external clock signal.

In addition, since the input or halt of the third internal clock signal CLK3 to the signal synchronizing circuit 5 is controlled by the operation mode control signal Sm and general purpose port input signal Sp, no additional control terminal is needed for the control, which enables misoperations during handling to be avoided.

EMBODIMENT 2

Figure 5:
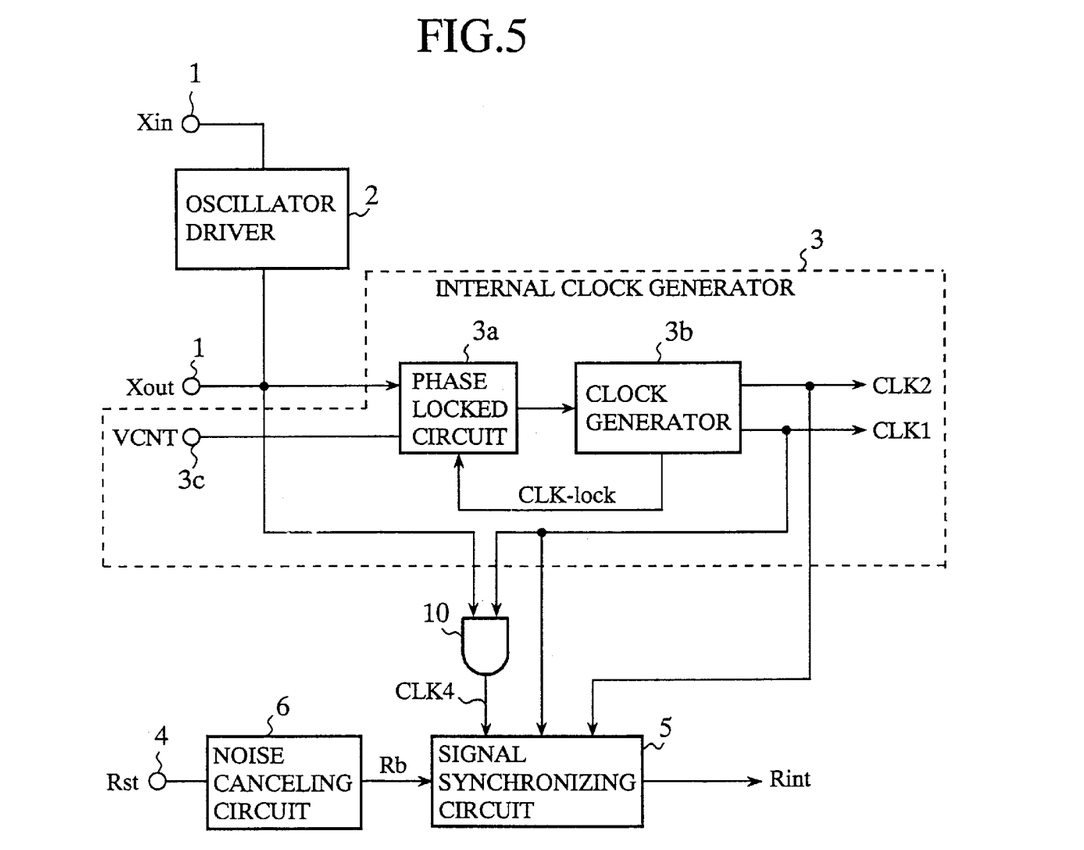
FIG. 5 is a block diagram showing a configuration of a reset signal input section and its associates of an embodiment 2 of a semiconductor device in accordance with the present invention.

FIG. 5 is a block diagram showing a configuration of the reset signal input section and its associates of an embodiment 2 of the semiconductor device in accordance with the present invention. In FIG. 5, the reference numeral 10 designates an internal clock frequency divider that inputs the first internal clock signal CLK1 fed from the internal clock generator 3 and the external clock signal Xout supplied through the external clock input terminal 1, and outputs a fourth internal clock signal CLK4 which is the logical AND of the two inputs. Thus, the fourth internal clock signal CLK4 has the same period as the external clock signal, that is, twice the period of the first internal clock signal CLK1. Since the remaining configuration is the same as that of the embodiment 1, description thereof is omitted here by designating the corresponding portions by the same reference numerals.

Next, the operation of the present embodiment 2 will be described.

Figure 6:
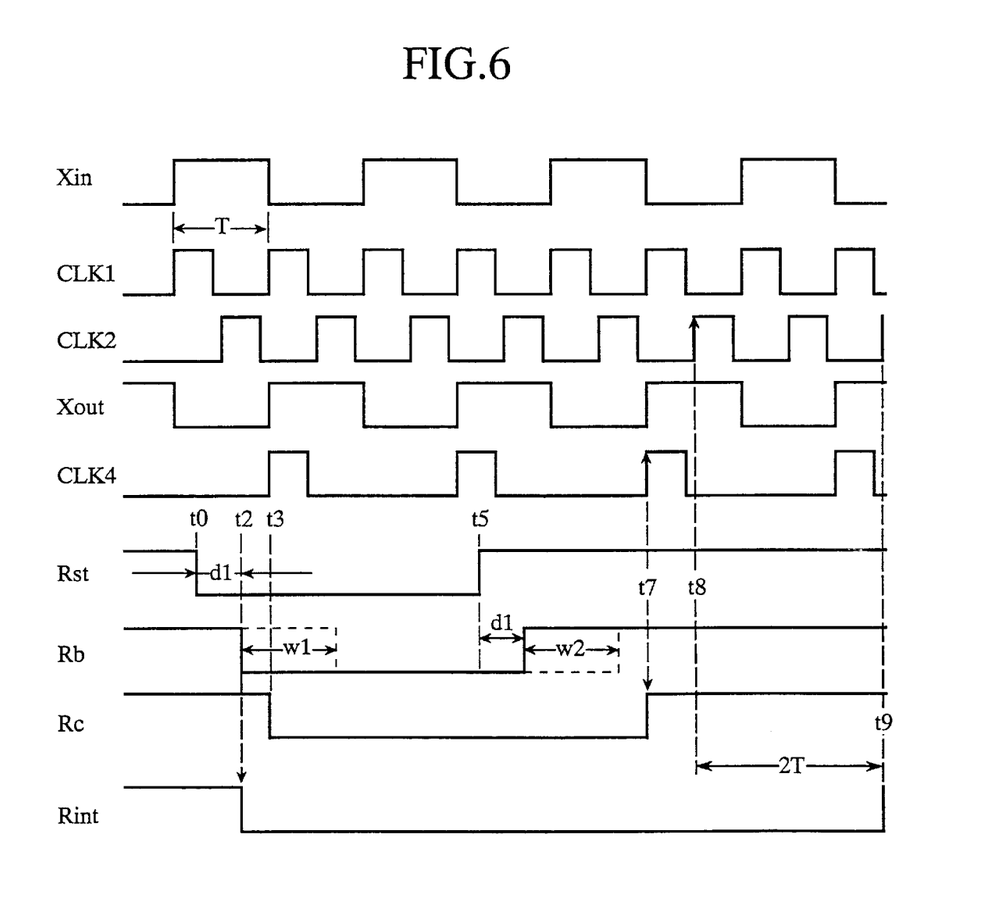
FIG. 6 is a timing chart illustrating timing relationships of important waveforms from the input of a reset signal Rst to the generation of an internal reset signal Rint in the embodiment 2.

FIG. 6 is a timing chart illustrating timing relationships of various waveforms from the input of the reset signal Rst to the generation of the internal reset signal Rint.

The data latch circuit 5a of the signal synchronizing circuit 5 is supplied with the fourth internal clock signal CLK4 having a period twice that of the first internal clock signal CLK1 output from the internal clock generator 3 as illustrated in FIG. 6. Accordingly, even if the reset signal Rb output from the noise canceling circuit 6 fluctuates within a range of twice the period of the first internal clock signal CLK1, the output timing of the internal reset signal Rint does not fluctuate.

As described above, the embodiment 2 comprises the internal clock frequency divider 10 for outputting the fourth internal clock signal CLK4 with a period twice that of the first internal clock signal CLK1. Thus, the timing of the rising edge of the internal reset signal Rint is kept stable even if the reset signal Rb input to the signal synchronizing circuit 5 fluctuates within the range of the two internal clock signal periods 2T owing to the fluctuations in the environment conditions like supply voltages or temperature. This offers an advantage of enabling the generation timings of the internal clock signals and internal reset signal Rint to be synchronized with the particular cycle of the external clock signal.

In addition, since the internal clock frequency divider 10 has a configuration that outputs the logical AND of the external clock signal and the first internal clock signal CLK1, no additional signal input is needed. This offers an advantage of enabling the clock signal synchronized with the external clock signal to be easily input to the signal synchronizing circuit 5, while synchronizing the fourth internal clock signal CLK4, which is output from the internal clock frequency divider 10, with the first internal clock signal CLK1.

EMBODIMENT 3

Figure 7:
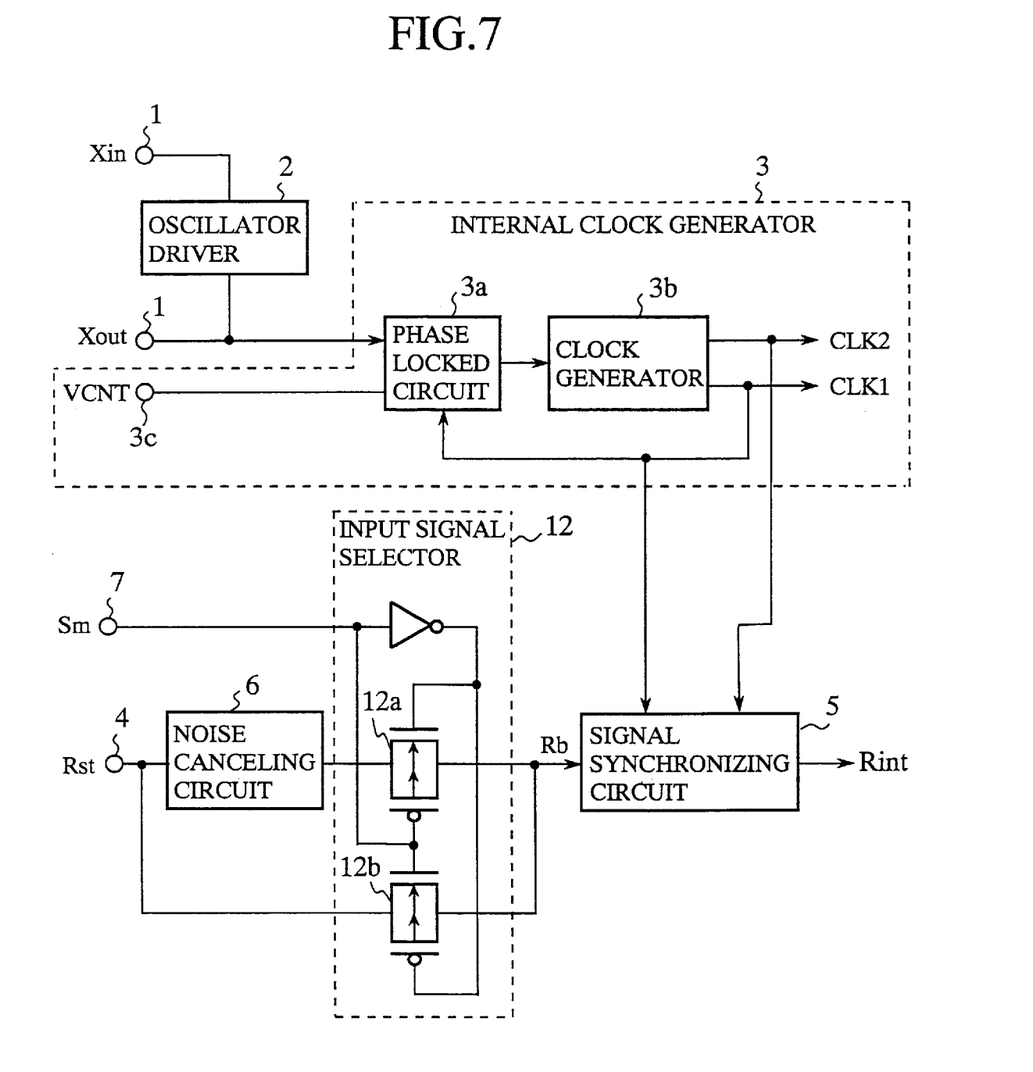
FIG. 7 is a block diagram showing a configuration of a reset signal input section and its associates of an embodiment 3 of a semiconductor device in accordance with the present invention.

FIG. 7 is a block diagram showing a configuration of a reset signal input section and its associates of an embodiment 3 of the semiconductor device in accordance with the present invention. In FIG. 7, the reference numeral 12 designates an input signal selector that has two switching elements 12a and 12b, and selectively brings one of them into conducting state in response to the operation mode control signal Sm. Here, the switching element 12a is connected between the noise canceling circuit 6 and signal synchronizing circuit 5, and the switching element 12b is connected between the external input terminal 4 and signal synchronizing circuit 5. Therefore, the signal synchronizing circuit 5 is supplied with either the reset signal Rb after the noise cancellation or the reset signal Rst before the noise cancellation in response to the operation mode control signal Sm. The switching elements 12a and 12b can be composed of CMOS devices consisting of N-channel and P-channel devices. Since the remaining portion is the same as that of the embodiment 1, the description thereof is omitted here.

Next, the operation of the embodiment 3 will be described.

Figure 8:
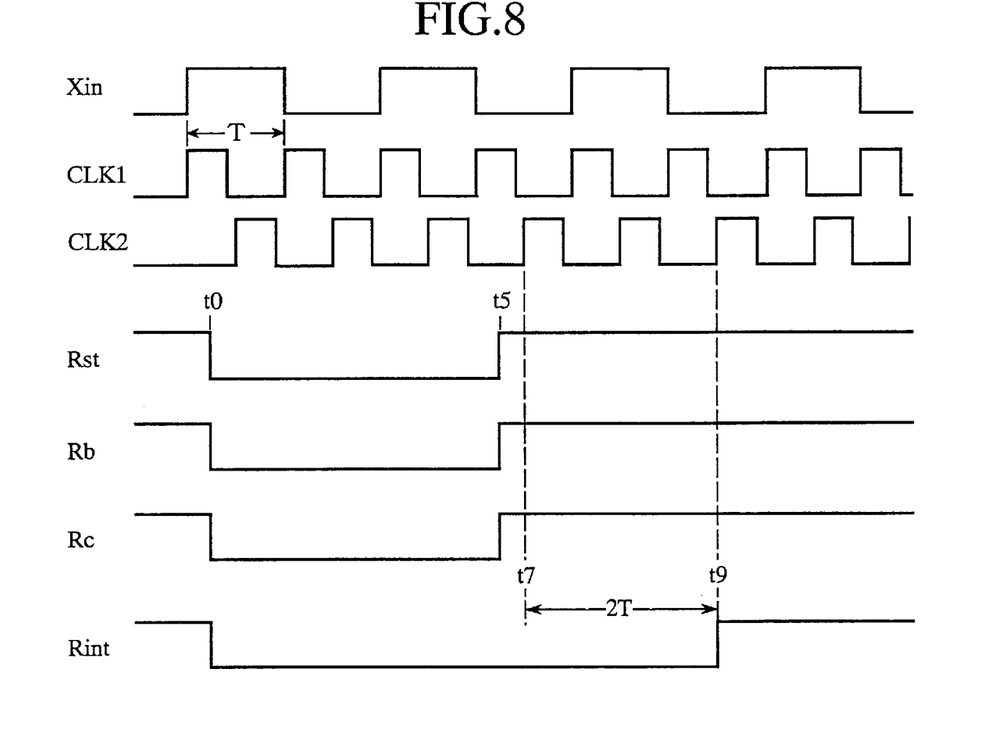
FIG. 8 is a timing chart illustrating timing relationships of important waveforms from the input of a reset signal Rst to the generation of an internal reset signal Rint in the embodiment 3.

FIG. 8 is a timing chart illustrating timing relationships of various waveforms from the input of the external reset signal Rst to the generation of the internal reset signal Rint, when a signal indicative of the test mode is input as the operation mode control signal Sm, and hence the switching element 12b is placed in the conduction state.

As shown in FIG. 8, since the external reset signal Rst is directly input to the data latch circuit 5a of the signal synchronizing circuit 5 with bypassing the noise canceling circuit 6, its input timing little varies in spite of the changes in the environmental condition such as supply voltages or temperature.

As described above, the present embodiment 3 comprises the input signal selector 12 for selectively bringing into conduction one of the switching elements 12a and 12b in response to the operation mode control signal Sm, in which the switching element 12a connects, through the noise canceling circuit 6, the signal synchronizing circuit 5 to the external input terminal 4 to which the reset signal Rst is input, and the switching element 12b connects them directly. This enables the external reset signal Rst to be directly input to the signal synchronizing circuit 5 by controlling the mode control signal. Thus, the timing of the rising edge of the internal reset signal Rint can be stably controlled in spite of the large fluctuations in the transfer delay of the noise canceling circuit 6 due to the changes in the environment conditions like supply voltages or temperature, independently of the self-oscillation of the internal clock generator 3 in synchronism with the external clock signal. In other words, controlling the operation mode control signal Sm enables the generation timings of the internal clock cycle and internal reset signal Rint to be synchronized with the particular cycle of the external clock signal.

In addition, since the input signal selector 12 is arranged such that it selectively brings one of the two switching elements 12a and 12b into conduction in response to the operation mode control signal Sm, the synchronization of the internal reset signal Rint with the external clock signal can be easily established by switching the mode. Besides, no additional control terminal is needed, which enables adverse effects during operation to be avoided.

What is claimed is:

1. A semiconductor device comprising:
    a first input terminal to which a first external input signal is applied;
    a second input terminal to which a second external input signal is applied;
    an external clock input terminal to which an external clock signal is applied;
    an internal clock generator for generating an internal clock signal synchronized with said external clock signal;
    a noise canceling circuit connected to said first input terminal for passing only said first external input signal with a width equal to or greater than a predetermined width;
    a signal synchronizing circuit for generating an internal input signal by latching and delaying an output of said noise canceling circuit; and
    an internal clock input halt circuit connected between said internal clock generator and said signal synchronizing circuit for suspending input of said internal clock signal to said signal synchronizing circuit in response to said second external input signal,
    wherein said signal synchronizing circuit generates said internal input signal in response to an output of said internal clock input halt circuit.

2. The semiconductor device as claimed in claim 1, wherein said second input terminal comprises at least two terminals for inputting an operation mode control signal for designating one of a test mode and a normal mode, and a general purpose port input signal fed from a general purpose register in said semiconductor device, and wherein said internal clock halt circuit controls input and suspension of said internal clock signal to said signal synchronizing circuit in response to said operation mode control signal and said general purpose port input signal.

3. The semiconductor device as claimed in claim 1, wherein said first external input signal is a reset signal for resetting said semiconductor device.

4. The semiconductor device as claimed in claim 1, wherein said internal clock generator comprises a phase locked circuit that continues self-oscillation and synchronizes a self-oscillated signal to said external clock signal.

5. A semiconductor device comprising:
    a first input terminal to which a first external input signal is applied;
    an external clock input terminal to which an external clock signal is applied;
    an internal clock generator for generating a first internal clock signal synchronized with said external clock signal by multiplying a frequency of said external clock signal;
    a noise canceling circuit connected to said first input terminal for passing only said first external input signal with a width equal to or greater than a predetermined width;
    an internal clock frequency divider connected to said internal clock generator for dividing a frequency of said first internal clock signal to generate a second internal clock signal; and
    a signal synchronizing circuit for generating an internal input signal by latching said external input signal in response to said second internal clock signal.

6. The semiconductor device as claimed in claim 5, wherein said internal clock frequency divider latches said external clock signal by said first internal clock signal, and outputs it as said second internal clock.

7. The semiconductor device as claimed in claim 5, wherein said first external input signal is a reset signal for resetting said semiconductor device.

8. The semiconductor device as claimed in claim 5, wherein said internal clock generator comprises a phase locked circuit that continues self-oscillation and synchronizes a self-oscillated signal to said external clock signal.

9. A semiconductor device comprising:
    a first input terminal to which a first external input signal is applied;
    a second input terminal to which a second external input signal is applied;
    an external clock input terminal to which an external clock signal is applied;
    an internal clock generator for generating an internal clock signal synchronized with said external clock signal;
    a noise canceling circuit connected to said first input terminal for passing only said first external input signal with a width equal to or greater than a predetermined width;

an input signal select circuit for selectively connecting to its output one of said first input terminal and an output of said noise canceling circuit in response to said second external input signal; and a signal synchronizing circuit for generating an internal input signal by latching an output of said input signal select circuit in response to said internal clock signal.

10. The semiconductor device as claimed in claim 9, wherein said input signal select circuit comprises a first switching element connected between an output of said noise canceling circuit and an input of said signal synchronizing circuit, and a second switching element connected between said first input terminal and the input of said signal synchronizing circuit, and wherein said input signal select circuit selectively brings one of said first and second switching elements into conduction in response to said second external input signal.

11. The semiconductor device as claimed in claim 9, wherein said first external input signal is a reset signal for resetting said semiconductor device.

12. The semiconductor device as claimed in claim 9, wherein said internal clock generator comprises a phase locked circuit that continues self-oscillation and synchronizes a self-oscillated signal to said external clock signal.

* * * * *